US008218793B2

(12) United States Patent
Tsai et al.

(10) Patent No.: US 8,218,793 B2
(45) Date of Patent: Jul. 10, 2012

(54) APPARATUS AND MUTING CIRCUIT

(75) Inventors: Jen-Che Tsai, Taichung Hsien (TW); Yau-Wai Wong, Hsinchu County (TW)

(73) Assignee: Mediatek Inc., Hsin-Chu (TW)

( * ) Notice: Subject to any disclaimer, the term of this patent is extended or adjusted under 35 U.S.C. 154(b) by 1252 days.

(21) Appl. No.: 11/949,796

(22) Filed: Dec. 4, 2007

(65) Prior Publication Data
US 2008/0137882 A1    Jun. 12, 2008

Related U.S. Application Data

(60) Provisional application No. 60/869,352, filed on Dec. 11, 2006.

(51) Int. Cl.
H03F 99/00    (2009.01)
H04R 3/00    (2006.01)
(52) U.S. Cl. .................................. 381/120; 318/122
(58) Field of Classification Search .................. 381/122
See application file for complete search history.

(56) References Cited

U.S. PATENT DOCUMENTS

| | | | | |
|---|---|---|---|---|
| 4,947,431 A * | 8/1990 | Stroud et al. ................... 381/13 |
| 5,151,942 A * | 9/1992 | Sasaki ........................ 381/94.5 |
| 5,307,025 A * | 4/1994 | Colvin et al. ................ 330/267 |
| 5,488,258 A * | 1/1996 | Honda .......................... 307/64 |
| 5,682,121 A * | 10/1997 | Naokawa et al. ............ 330/252 |
| 5,768,601 A * | 6/1998 | Tran .............................. 713/300 |
| 5,825,251 A * | 10/1998 | Nakagawa ................... 330/297 |
| 6,091,292 A * | 7/2000 | Higashiyama et al. ........ 330/10 |
| 6,516,067 B1 * | 2/2003 | Lee ............................ 381/94.5 |
| 6,954,537 B2 | 10/2005 | Ng et al. |
| 2001/0019366 A1 * | 9/2001 | Hida ............................ 348/632 |
| 2003/0016836 A1 * | 1/2003 | Rashid ........................ 381/94.5 |
| 2005/0083115 A1 * | 4/2005 | Risbo ............................ 330/10 |
| 2005/0100177 A1 * | 5/2005 | Lee ............................ 381/94.5 |
| 2006/0050882 A1 * | 3/2006 | Tsubokawa .................. 380/225 |
| 2007/0009110 A1 * | 1/2007 | Kakumoto et al. .......... 381/104 |
| 2008/0008330 A1 * | 1/2008 | Tseng ............................. 381/59 |
| 2008/0036495 A1 * | 2/2008 | Fujimura ....................... 326/56 |

FOREIGN PATENT DOCUMENTS

| | | |
|---|---|---|
| CN | 1767375 | 5/2006 |
| EP | 1 689 075 | 8/2006 |
| JP | 2006-067025 | 3/2006 |
| WO | WO 2004/025830 | 3/2004 |

OTHER PUBLICATIONS

English language translation of JP 2006-067025 (published Mar. 9, 2006).
English language translation of abstract of CN 1767375 (published May 3, 2006).

* cited by examiner

*Primary Examiner* — Kiesha Bryant
*Assistant Examiner* — Igwe U Anya
(74) *Attorney, Agent, or Firm* — Thomas|Kayden

(57) ABSTRACT

An apparatus and a muting circuit. The apparatus comprises an amplifier, a mute circuit, a pull-down circuit, and a power detection circuit. The amplifier receives a power supply voltage and a common mode voltage, and amplifies an audio input signal to generate an audio output signal. The mute circuit, coupled to the amplifier, conducts the audio output signal to about ground level upon receiving a mute signal. The pull-down circuit, coupled to the amplifier, pulls the common mode voltage to about ground level upon receiving a pull-down signal. The power detection circuit, coupled to the mute circuit and the pull-down circuit, detects power-up or power-down of the power supply voltage, and generates the mute signal and a pull-down signal according to the power-up or power-down operation.

22 Claims, 12 Drawing Sheets

APPARATUS AND MUTING CIRCUIT

CROSS REFERENCE

This application claims the benefit of U.S. provisional application Ser. No. 60/869,352 filed Dec. 11, 2006, the subject matter of which is incorporated herein by reference.

BACKGROUND OF THE INVENTION

1. Field of the Invention

The invention relates to an audio apparatus and in particular to a muting circuit utilized therein.

2. Description of the Related Art

Conventional audio systems typically utilize a muting circuit to disable audio output when the signal is undesirable or unnecessary. Such audio systems typically include audio amplifiers that amplify the input to drive a load such as a speaker. When muting is activated, the amplified audio signal is attenuated with respect to the input signal.

It is desirable to have a muting circuit that not only functions effectively while an audio system is powered-on but also during the system's power on/off cycle, since, when a power source of an audio amplifier is turned on or off, a sudden rising or falling of voltage is induced to cause a loud pop noise. Although the pop occurs only momentarily, it can cause damage to sensitive audio speakers.

A need exists for a muting circuit removing or reducing the pop noise during an abrupt change of the audio output in an audio apparatus.

BRIEF SUMMARY OF THE INVENTION

A detailed description is given in the following embodiments with reference to the accompanying drawings.

According to the invention, an apparatus comprises an amplifier, a mute circuit, a pull-down circuit, and a power detection circuit. The amplifier receives a power supply voltage and a common mode voltage, and amplifies an audio input signal to generate an audio output signal. The mute circuit, coupled to the amplifier, conducts the audio output signal to about ground level upon receiving a mute signal. The pull-down circuit, coupled to the amplifier, pulls the common mode voltage to about ground level upon receiving a pull-down signal. The power detection circuit, coupled to the mute circuit and the pull-down circuit, detects power-up or power-down of the power supply voltage, and generates the mute signal and a pull-down signal according to the power-up or power-down operation.

According to the invention, a muting circuit comprises a mute circuit, a pull-down circuit, and a power detection circuit. The mute circuit, coupled to an amplifier, receives an audio output signal of the amplifier, and conducts the audio signal to about ground level upon receiving a mute signal. The pull-down circuit, coupled to the amplifier, pulls a common mode voltage of the amplifier to about ground level upon receiving a pull-down signal. The power detection circuit, coupled to the mute circuit and the pull-down circuit, detects power-up or power-down of the power supply voltage, and generates the mute signal and a pull-down signal according to the power-up or power-down operation.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
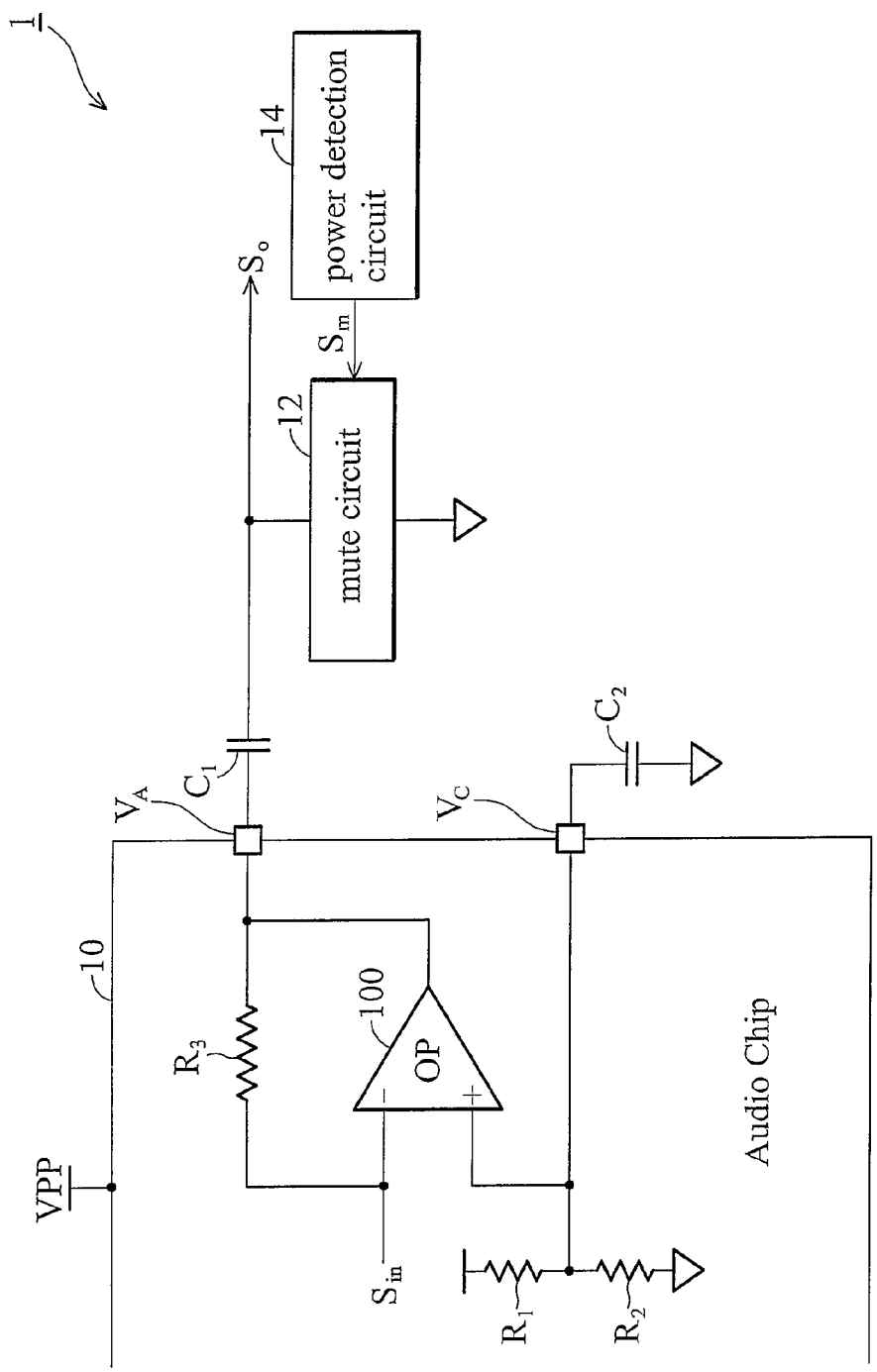
FIG. 1 is a block diagram of an exemplary audio apparatus according to the invention.

FIG. 1 is a block diagram of an exemplary audio apparatus according to the invention, comprising audio chip 10, mute circuit 12, power detection circuit 14, first capacitor $C_1$ and second capacitor $C_2$. Audio chip 10 is coupled to capacitors $C_1$ and $C_2$, and mute circuit 12 is coupled to capacitor $C_1$ and power detection circuit 14.

Upon a power-up or power-down operation, a sudden rising or falling of voltage occurs in an audio output signal, resulting in an undesirable pop noise. The embodiment in FIG. 1 solves the pop noise issue by conducting an audio output $S_o$ to about ground level via a mute circuit during the power-up or power-down operation.

Audio chip 10 produces the audio output $S_o$ to generate an audio sound played by, but is not limited to, a speaker arrangement (not shown). Audio chip 10 comprises operational amplifier 100 and resistors R1, R2, and R3. Audio chip 10 may receive power supply voltage VPP from, but is not limited to, an external analog power source, to provide power supply to circuit components therein. Operational amplifier 100 includes an inverting input, a non-inverting input, and an output.

Operational amplifier 100 receives audio input signal $S_{in}$ at the inverting input and common mode voltage $V_C$ at the non-inverting input to generate audio output signal $S_o$ at the output thereof. Common mode voltage $V_C$ may be tied a substantially constant voltage level. Audio input signal $S_{in}$ may be, but is not limited to, a differential signal measured in relation to the common mode voltage $V_C$. Common mode voltage $V_C$ may be, but is not limited to, an analog common mode reference voltage, and may be produced by, but is not limited to, a voltage divider comprising resistors R1 and R2.

In operation, the DC level of audio output signal $V_A$ follows closely to that of common mode voltage $V_C$.

Direct current (DC) blocking capacitor $C_1$ filters out undesirable DC component in audio output signal $S_o$, and passes the filtered audio output signal $S_o$ to the speaker arrangement for output. Decoupling capacitor $C_2$ is sufficiently large to maintain common mode voltage $V_C$ being substantially constant throughout operation of audio chip 10.

Power detection circuit 14 detects power variation during power-up or power-down, and generates mute signal $S_m$ to control mute circuit 12. Mute circuit 12 directs audio output signal $S_o$ to about ground level upon receiving mute signal $S_m$, so that pop noise from the power-up or power-down operation is not output to the speaker.

Figure 2:
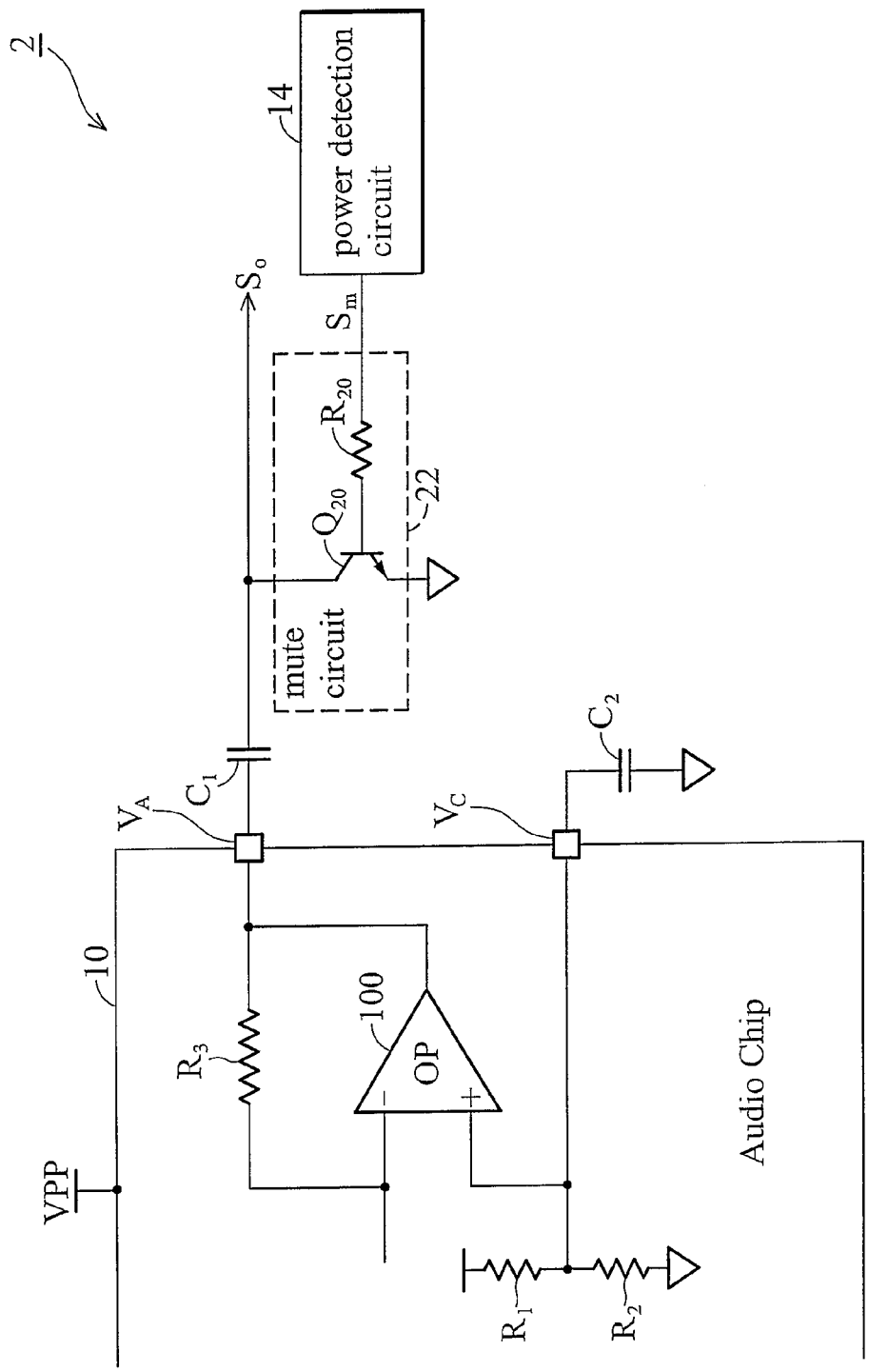
FIG. 2 shows a circuit schematic of an exemplary mute circuit in FIG. 1.

FIG. 2 shows a circuit schematic of an exemplary mute circuit in FIG. 1, comprising transistor Q20 and resistor 20 coupled thereto. In normal operation, transistor Q20 is disabled so that audio output signal $S_o$ is transmitted to the speaker for output. Upon receipt of mute signal $S_m$, transistor Q20 is turned on through resistor 20 to provide an electrical path to shunt audio output signal $S_o$ to about ground level, preventing the pop noise from output to the speaker.

Figure 3:
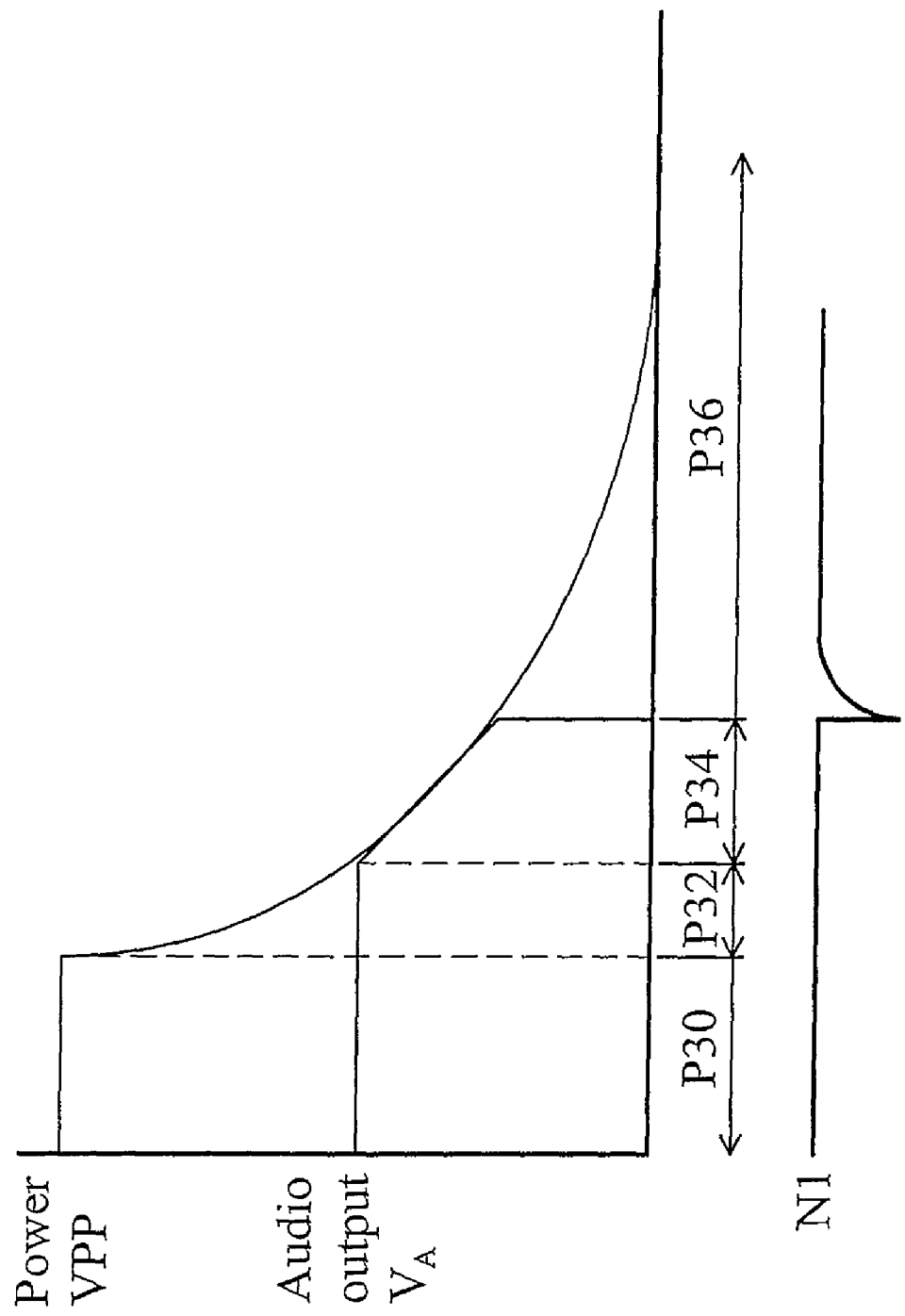
FIG. 3 shows signal behavior of the power supply voltage and the audio output signal during a power-down operation in the audio system of FIG. 1.

While audio apparatus 1 of FIG. 1 is generally able to ground the audio output signal $S_o$, it still suffers from inadequate muting of output signal $S_o$ during an abrupt change of output signal $S_o$, as demonstrated in FIG. 3. FIG. 3 shows signal behavior of the power supply voltage and the audio output signal during a power-down operation using the audio system of FIG. 1, where the horizontal axis represents time and vertical axis represents voltage level.

Referring to FIG. 3, power supply voltage VPP is at a level higher than audio output signal $S_o$ at audio output node $V_A$ in normal operation (period P30). At the end of period P30, power supply voltage VPP of audio chip 10 is turned off, thus the voltage level of power supply voltage VPP drops through periods P32 to P36 until reaching ground voltage. Audio output signal $S_o$ remains at the level of common mode voltage $V_C$ in period P32, until power supply voltage VPP subsides below common mode voltage $V_C$. During the period P34, the common mode voltage $V_C$ does not follow the power supply voltage VPP and keeps its level due to the decoupling capacitor $C_2$. However, the audio output signal $V_A$ follows the power supply voltage VPP because it cannot exceed VPP. Despite the effort of mute circuit 12 to shut audio output signal $S_o$ to about ground level, the mute circuit 12 cannot suppress an abrupt voltage jump at the audio output node $V_A$. At the end of the period P34, the amplifier 100 fails, the audio output signal $V_A$ drops abruptly, resulting in pop noise N1 appearing at audio output node $V_A$, and also appearing at the audio output signal $S_o$.

During the period P34, the audio output signal $V_A$ follows the descending power supply voltage VPP because $V_A$ cannot exceed VPP. At the end of the period P34, the audio output signal $V_A$ may drop abruptly because VPP is too low for the amplifier 100 to work properly. The abrupt jump of the audio output signal $V_A$ will cause a pop noise at the audio output signal $S_o$ as shown in N1 of FIG. 3.

Figure 4:
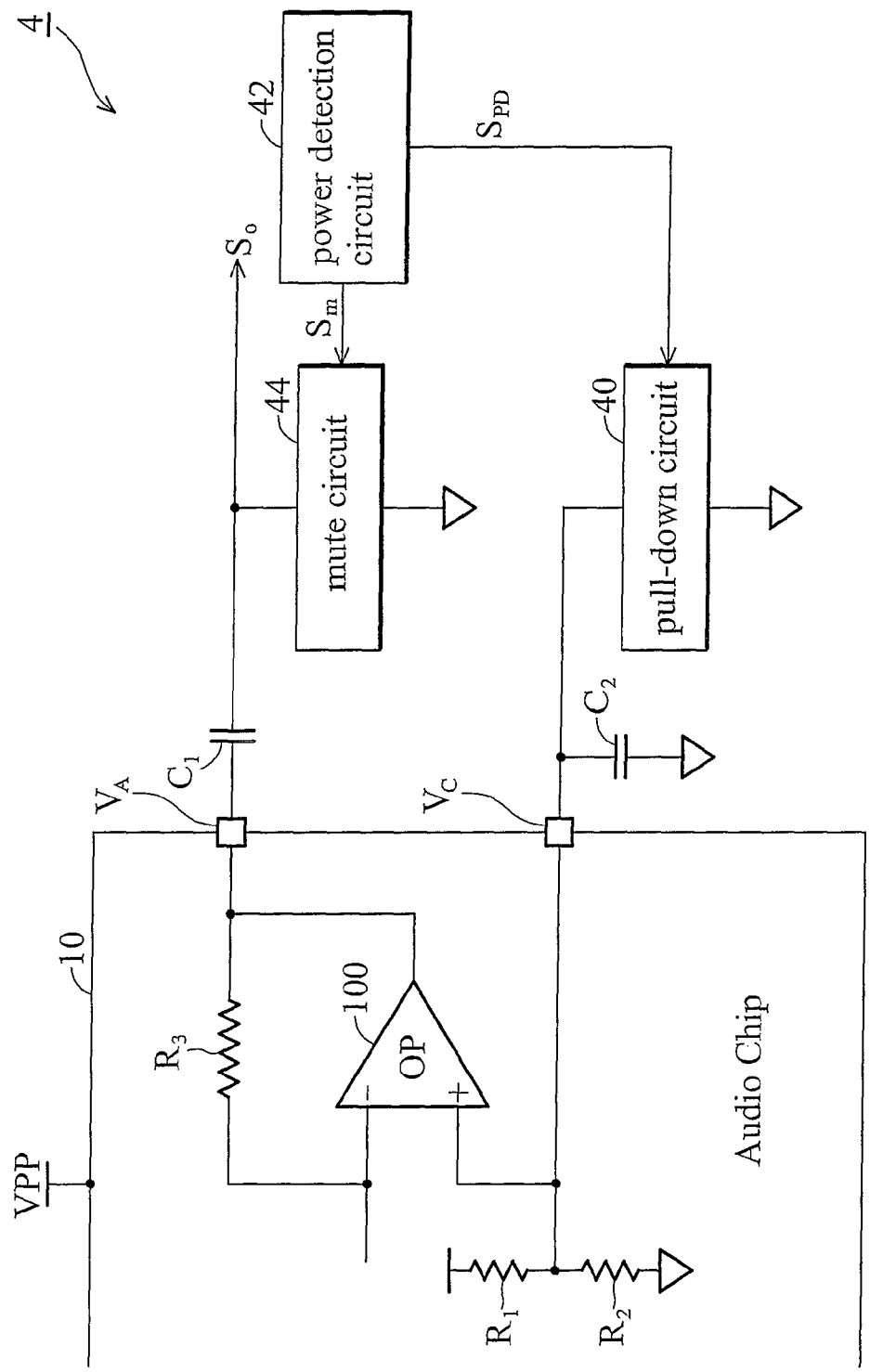
FIG. 4 is a block diagram of another exemplary audio apparatus according to the invention.

FIG. 4 is a block diagram of another exemplary audio apparatus according to the invention, comprising audio chip 10, pull-down circuit 40, power detection circuit 42, mute circuit 44, capacitors $C_1$ and $C_2$. Audio chip 10 is coupled to capacitors $C_1$ and $C_2$, capacitor $C_1$ is coupled to mute circuit 44, capacitor $C_2$ is coupled to pull-down circuit 40, and pull-down circuit 40 and mute circuit 44 are coupled to power detection circuit 42.

Upon power-up or power-down operation, the audio apparatus in FIG. 4 utilizes pull-down circuit 40 to draw common mode voltage $V_C$ to about ground level, as well as mute circuit 44 to conduct audio output signal $S_o$ to about ground level, so that pop noise ceases to occur at the speaker (not shown).

While FIG. 4 shows an operating amplifier, amplifier 100 may be, but is not limited to, a differential amplifier, a comparator, a sense amplifier or an operational amplifier. The amplifier 100 receives power supply voltage VPP and common mode voltage $V_C$, and amplifies audio input signal $S_{in}$ (not shown) to generate audio output signal $S_o$ at output node $V_A$. Power supply voltage VPP may be an analog or digital power supply. Audio input signal $S_{in}$ may be a differential signal measured in relation to the common mode voltage $V_C$. Power detection circuit 42 detects power-up or power-down of power supply voltage VPP, and generates mute signal $S_m$ and a pull-down signal $S_{PD}$ according to the power-up or power-down operation. Mute circuit 44 conducts audio output signal $S_o$ to about ground level upon receiving mute signal $S_m$. Pull-down circuit 40 pulls common mode voltage $V_C$ to about ground level upon receiving pull-down signal $S_{PD}$.

Decoupling capacitor $C_2$ may be coupled to the non-inverting node of operational amplifier 100. Decoupling capacitor $C_2$ may be an on-chip capacitor or an off-chip capacitor and may comprise one or more capacitors. Decoupling capacitor $C_2$ may have a constant capacitance value or a varying capacitance value. A varying capacitance value of capacitor $C_2$ may be obtained by any method of varying a capacitance of a capacitor including, but not limited to, when capacitor $C_2$ is an off-chip capacitor, setting the capacitance of capacitor $C_2$ at a selected value by choosing the off-chip capacitor with an appropriate capacitance value and, when the capacitor $C_2$ is formed of multiple capacitors coupled via switches, varying the capacitance of the capacitor $C_2$ by opening and closing switches between the capacitors to achieve a desired combinative capacitance value. The capacitance of capacitor $C_2$ may be varied before or prior to generation of the common mode voltage.

Power detection circuit 42 generates pull-down signal $S_{PD}$ prior to the power supply voltage VPP falling below a minimal operating voltage of the amplifier. Amplifier 100 has a minimal operating voltage assuring proper operation, a biased signal thereof (not shown) cannot be established if power supply voltage VPP is less than the minimal operating voltage. As common mode voltage $V_C$ is pulled down to about ground level, audio output signal $S_o$ also tracks common mode voltage $V_C$ to about ground level prior to amplifier losing the biased signal. Thus mute circuit 44 can mute audio output signal $S_o$, reducing or removing the pop noise during the power-up and power-down. Power detection circuit 42 may generate only mute signal $S_m$ during the power-up operation, and generate mute signal $S_m$ and pull-down signal $S_{PD}$ during the power-down operation.

Figure 5:
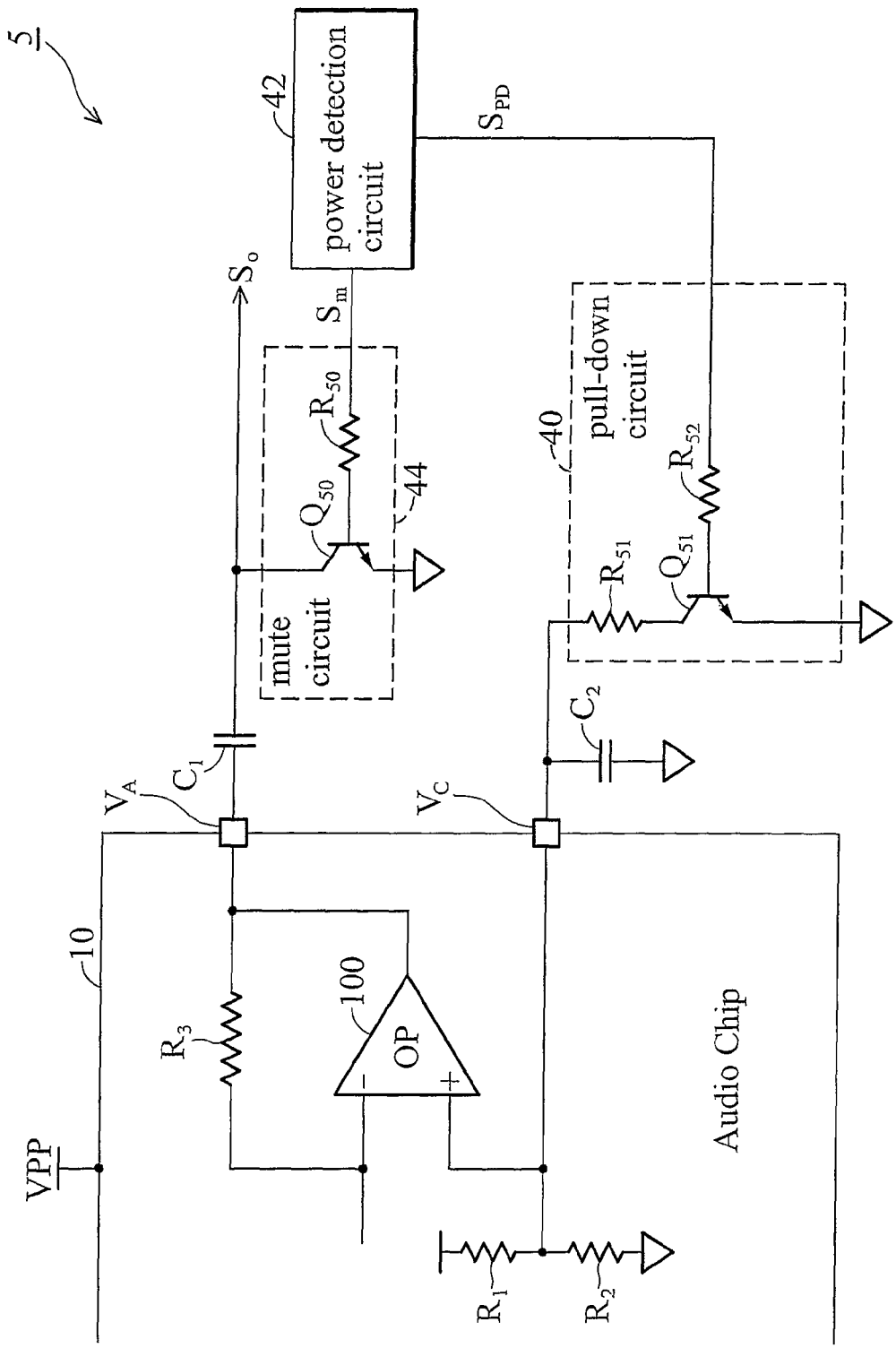
FIG. 5 is a circuit schematic of an exemplary audio apparatus in FIG. 4.

FIG. 5 is a circuit schematic of an exemplary audio apparatus in FIG. 4, wherein mute circuit comprises transistor Q50 and resistor R50 coupled thereto, and pull-down circuit comprises transistor Q51 and resistors R51 and R52.

Upon receiving pull-down signal $S_{PD}$, a base voltage is established at the base terminal of transistor 51 through resistor 52, thereby enabling transistor Q51 to pull down common mode voltage $V_C$.

Figure 6:
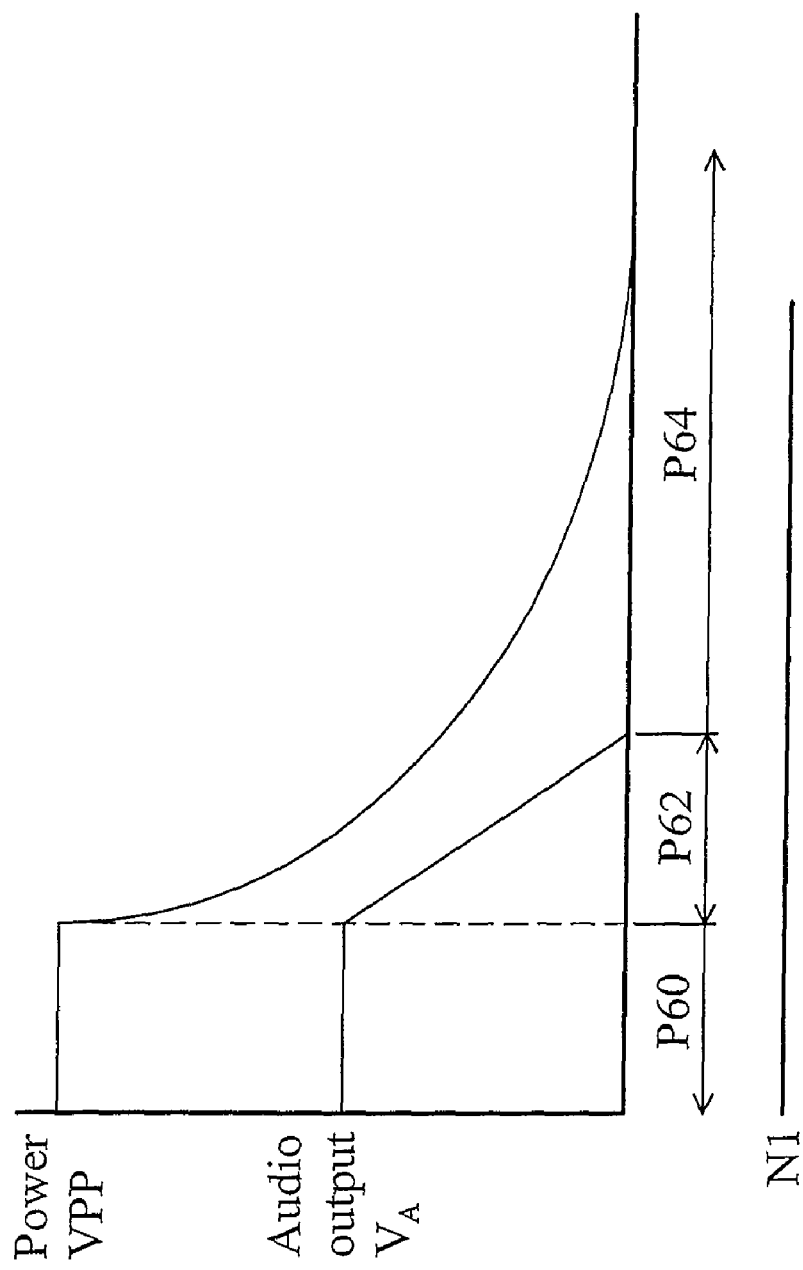
FIG. 6 shows signal behavior of the power supply voltage and the audio output signal during a power-down operation of the audio system in FIG. 4.

FIG. 6 shows signal behavior of the power supply voltage and the audio output signal during a power-down operation of the audio system in FIG. 4, where the horizontal axis represents time and vertical axis represents voltage level.

In period P60, power supply voltage VPP remains at a substantially constant level higher than audio output signal $S_o$ at audio output node $V_A$. In period 62, power is switched off, power supply voltage VPP decreases, mute signal $S_m$ and pull-down signal $S_{PD}$ are sent to mute circuit 44 and pull-down circuit 40 to pull both audio output signal $S_o$ and common mode voltage $V_C$ down, thus audio output signal $S_o$ at audio output node $V_A$ reduces steadily, reaching the ground level prior to the amplifier 100 losing the biased signal, and suppressing and removing pop noise $N_1$ in P64.

Figure 7:
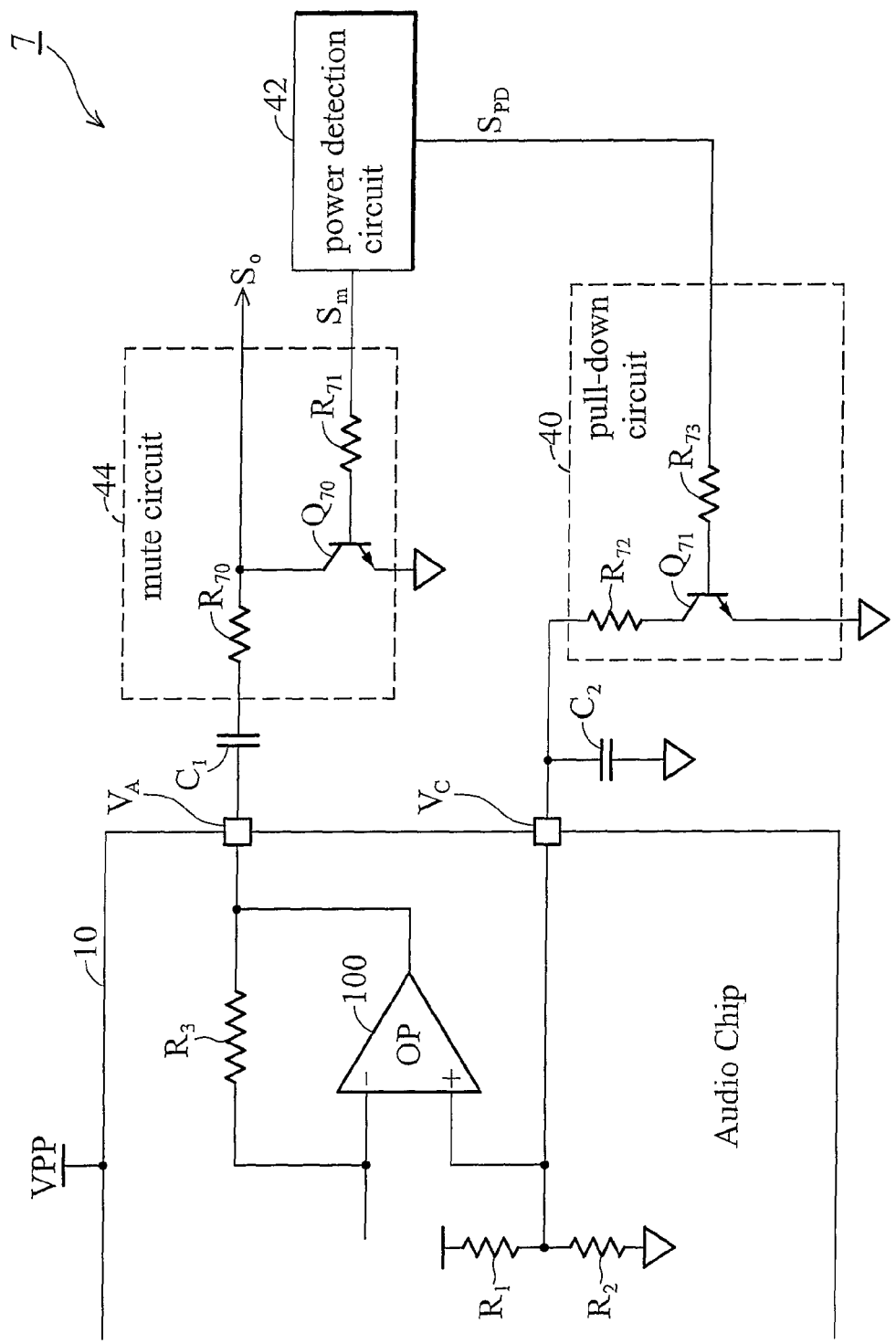
FIG. 7 is a circuit schematic of another exemplary embodiment of the audio system in FIG. 4.

FIG. 7 is a circuit schematic of another exemplary embodiment of the audio system in FIG. 4, in which mute circuit 44 comprises transistor 70 and resistors R70 and R71, pull-down circuit 40 comprises transistor Q71 and resistors R72 and R73.

Mute circuit 44 includes resistor R70 between DC blocking capacitor $C_1$ and transistor Q70, helping transistor Q70 to pull audio output signal $S_o$ low when loading of the next stage (the speaker) is high.

Figure 12:
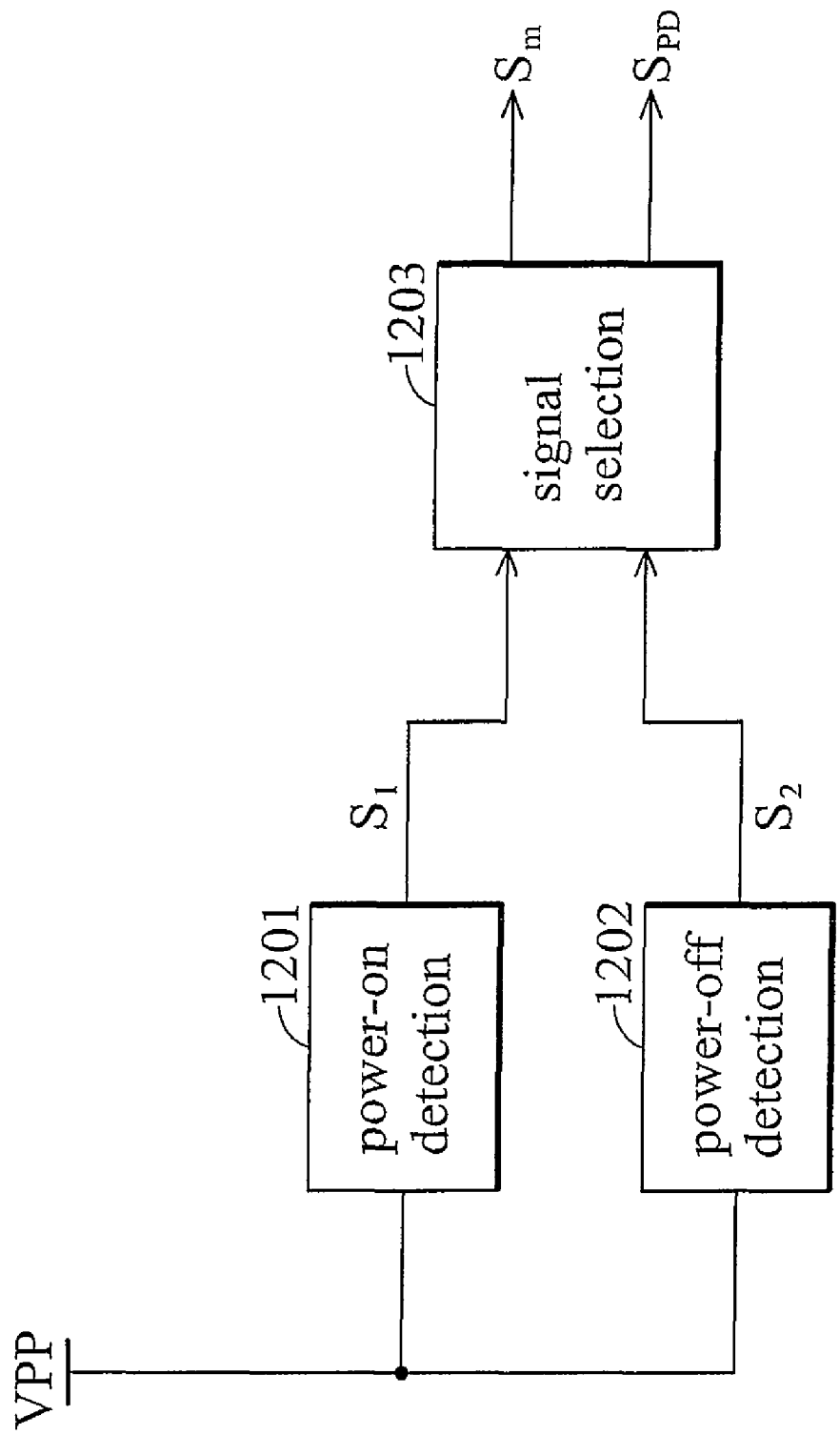
FIG. 12 shows an embodiment of the power detection circuit 42 shown in FIG. 4.

FIG. 12 shows an embodiment of the power detection circuit 42 shown in FIG. 4. The power detection circuit 42 comprises a power-on detection unit 1201, a power-off detection unit 1202 and a signal selection unit 1203. When a power-on operation occurs, the power-on detection unit 1201 detects it and generates a first signal S1. On the other hand, when a power-down operation occurs, the power-off detection unit 1202 detects it and generates a second signal S2. The signal selection unit 1203 combines the first signal S1 and the second signal S2 to generate the mute signal $S_m$ or the pull-down signal $S_{PD}$. In one embodiment, the mute signal $S_m$ goes to a high logic state for a time period when the power-on or the power-down operation occurs. On the other hand, the pull-down signal $S_{PD}$ goes to a high logic state for a time period only when a power-down operation occurs. In other embodiments, based on different design requirements, different combinations of power-on/off processes to generate different mute signals $S_m$ or pull-down signals $S_{PD}$ are possible.

Figure 8:
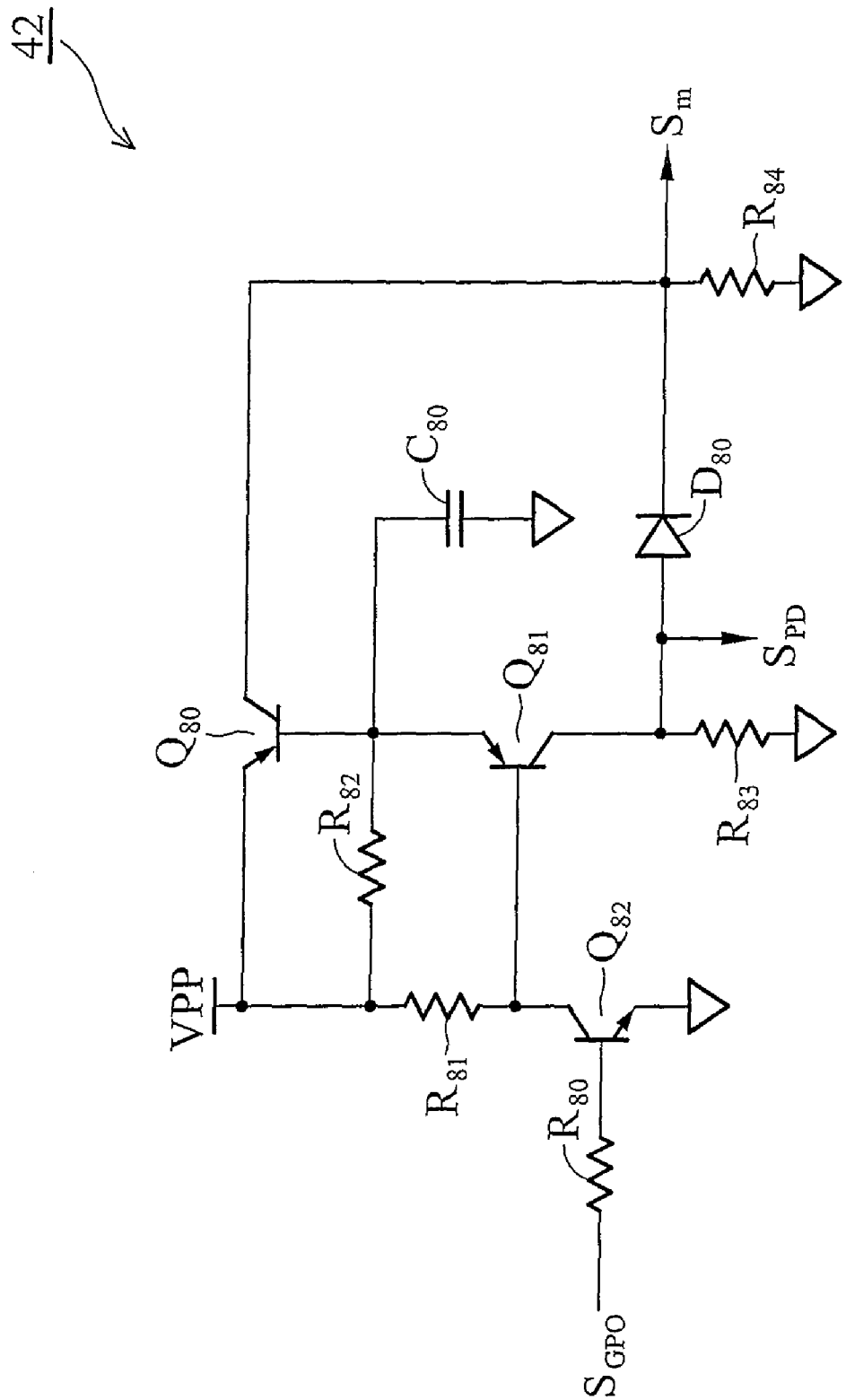
FIG. 8 is a circuit schematic of an exemplary power detection circuit incorporated in FIG. 4.

FIG. 8 is a circuit schematic of an exemplary power detection circuit incorporated in FIG. 12, comprising transistors Q80 through Q82, resistors R80 through R84, capacitor C80, and diode D80. The combination of the transistor Q80, the resistor R82, and the capacitor C80 serves as the power-on detection unit 1201 shown in FIG. 12. The combination of the transistor Q81, the resistor R81, and the capacitor C80 serves as the power-off detection unit 1202. The diode D80 serves as the signal selection unit 1203. The signal transmitted through the collector of the transistor Q80 can be regarded as the first signal S1. The signal transmitted through the collector of the transistor Q81 can be regarded as the second signal S2. The mute signal $S_m$ and the pull-down signal $S_{pd}$ can be regarded as two outputs of the signal selection unit 1203.

Transistor Q80 has first base, emitter and collector, transistor Q81 has second base, emitter and collector, transistor Q82 has third base, emitter and collector. First emitter is coupled to power supply voltage VPP, first base is coupled to second emitter, resistor R82, and capacitor C80, first collector is coupled to resistor R84, diode D80, and mute signal $S_m$. Second base is coupled to resistor R81 and third collector, and second collector is coupled to resistor R83, pull-down signal $S_{PD}$, and diode D80. Third base is coupled to resistor R80, and third emitter is coupled to ground. Capacitor C80 is coupled between resistor R82 and ground. Diode D80 is coupled between pull-down signal $S_{PD}$ and mute signal $S_m$.

Transistor Q80 generates mute signal $S_m$ during a power-up operation. Transistor Q81 generates mute signal $S_m$ and pull-down signal $S_{PD}$ during a power-down operation. Capacitor C80 enables transistor Q80 during the power-up, and transistor Q81 during the power-down. Diode D80 is configured in forward biased connection from pull-down signal $S_{PD}$ to mute signal $S_m$.

In power-up operation, power supply voltage VPP ramps up gradually, the voltage potential at first emitter rises while the voltage potential at first base remains low due to capacitor C80, thus transistor Q80 is turned on, collector current thereof propagates to resistor R84 to establish a voltage for mute signal $S_m$. Concurrently, the voltage level at second base increases while the voltage at second emitter remains low due to capacitor C80, disabling transistor Q81 and pull-down signal outputs low.

In power-down operation, power supply voltage VPP falls back steadily, the voltage potential at first emitter decreases while the voltage potential at first base remains high due to capacitor C80, thus transistor Q80 is turned off. Concurrently, the voltage level at second base decreases while the voltage at second emitter remains high power supply voltage VPP due to capacitor C80, enabling transistor Q81, the collector current thereof establishes a voltage potential for pull-down signal through resistor R83, and a voltage potential for mute signal $S_m$ after a voltage drop across diode D80.

In normal operation, power supply voltage VPP and the voltage level across C80 are both high, shutting off both transistors Q80 and Q81, resulting in 0v for both pull-down signal $S_{PD}$ and mute signal $S_m$, audio output signal $S_o$ propagating to speaker device accordingly.

GPIO control signal SGPO may be issued from audio chip 10 in a predetermined power-down event to generate mute signal $S_m$ and pull-down signal $S_{PD}$ accordingly. Upon receipt of GPIO control signal SGPO in a known power-down event, transistor Q82 is turned on, such that the voltage potentials at first emitter and second base decrease, while the voltages at first base and second emitter remain high by capacitor C80, thus turning off transistor Q80 and turning on transistor Q81, generating pull-down signal $S_{PD}$ and mute signal $S_m$ consequently.

Figure 9:
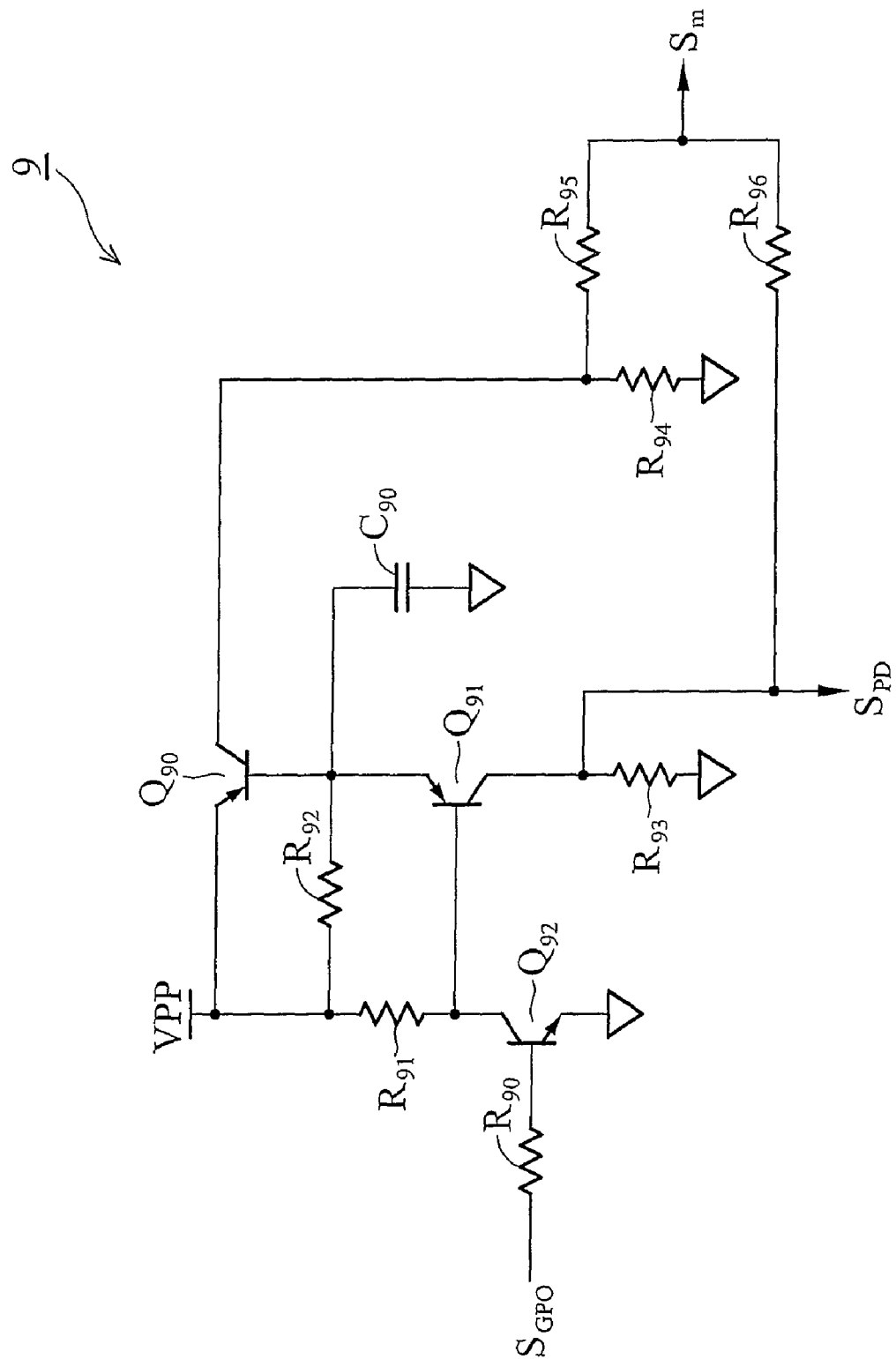
FIG. 9 is a circuit schematic of another exemplary power detection circuit according to the invention.

FIG. 9 is a circuit schematic of another exemplary power detection circuit according to the invention, comprising transistors Q90 to Q92, resistors R90 through R96, capacitor C90. The combination of the transistor Q90, the resistor R92, and the capacitor C90 serves as the power-on detection unit 1201 shown in FIG. 12. The combination of the transistor Q91, the resistor R91, and the capacitor C90 serves as the power-off detection unit 1202. The resistors R93 through R96 serve as the signal selection unit 1203. The signal transmitted through the collector of the transistor Q90 can be regarded as the first signal S1. The signal transmitted through the collector of the transistor Q91 can be regarded as the second signal S2. The mute signal $S_m$ and the pull-down signal $S_{pd}$ can be regarded as two outputs of the signal selection unit 1203.

Transistor Q90 has first base, emitter and collector, transistor Q91 has second base, emitter and collector, transistor Q92 has third base, emitter and collector. First emitter is coupled to power supply voltage VPP, first base is coupled to second emitter, resistor R92, and capacitor C90, first collector is coupled to resistors R94 and R95. Second base is coupled to resistor R91 and third collector, and second collector is coupled to resistor R93, pull-down signal $S_{PD}$, and resistor R96. Third base is coupled to resistor R90, and third emitter is coupled to ground. Capacitor C90 is coupled between resistor R92 and ground. Resistor R96 is coupled between pull-down signal and mute signal.

Transistor Q90 generates mute signal $S_m$ during a power-up operation, and transistor Q91 generates mute signal $S_m$ and pull-down signal $S_{PD}$ during a power-down operation. Capacitor C90 enables transistor Q90 and disables transistor Q91 during the power-up, and enables transistor Q91 and disables transistor Q90 the power-down. Resistors R95 and R96 are coupled in series to form a voltage divider, generating pull-down signal $S_{PD}$ such that the pull-down circuit cannot pull down common mode voltage $V_C$ during the power-up.

In power-up operation, power supply voltage VPP ramps up gradually, the voltage potential at first emitter rises while the voltage potential at first base remains low due to capacitor C90, thus transistor Q90 is turned on, and collector current thereof propagates to resistor R94 to establish a power-up voltage thereacross. The voltage divider formed by resistors R95 and R96 generates mute signal $S_m$ and pull-down signal $S_{PD}$. The resistance of resistors R95 and R96 may be selected such that mute signal $S_m$ is high enough to enable the mute circuit and pull-down signal $S_{PD}$ is low enough to disable the pull-down circuit. Concurrently, the voltage level at second base increases while the voltage at second emitter remains low power supply voltage VPP due to capacitor C90, thus transistor Q91 is disabled.

In power-down operation, power supply voltage VPP falls back steadily, the voltage potential at first emitter decreases while the voltage potential at first base remains high due to capacitor C90, thus transistor Q90 is turned off. Concurrently, the voltage level at second base decreases while the voltage at second emitter remains high due to capacitor C90, enabling transistor Q91, the collector current thereof propagates to resistor R93 to establish a power-down voltage thereacross. The voltage divider formed by resistors R95 and R96 uses the power-down voltage to generate mute signal $S_m$ and pull-down signal $S_{PD}$. The resistance of resistors R95 and R96 may be selected such that both pull-down signal $S_{PD}$ and mute signal $S_m$ are high enough to enable pull-down circuit and the mute circuit. Note pull-down signal $S_{PD}$ is at a higher voltage potential in power-down operation than in power-up operation.

In normal operation, power supply voltage VPP and the voltage level across C90 are both high, shutting off both transistors Q90 and Q91, resulting in 0v for both pull-down signal $S_{PD}$ and mute signal $S_m$, audio output signal $S_o$ propagating to speaker device accordingly.

Upon receipt of GPIO control signal SGPO in a known power-down event, transistor Q92 is turned on, such that the voltage potentials at first emitter and second base decreases, while the voltages at first base and second emitter remain high by capacitor C90, thus turning off transistor Q90 and turning on transistor Q91, generating pull-down signal $S_{PD}$ and mute signal $S_m$ consequently.

Figure 10:
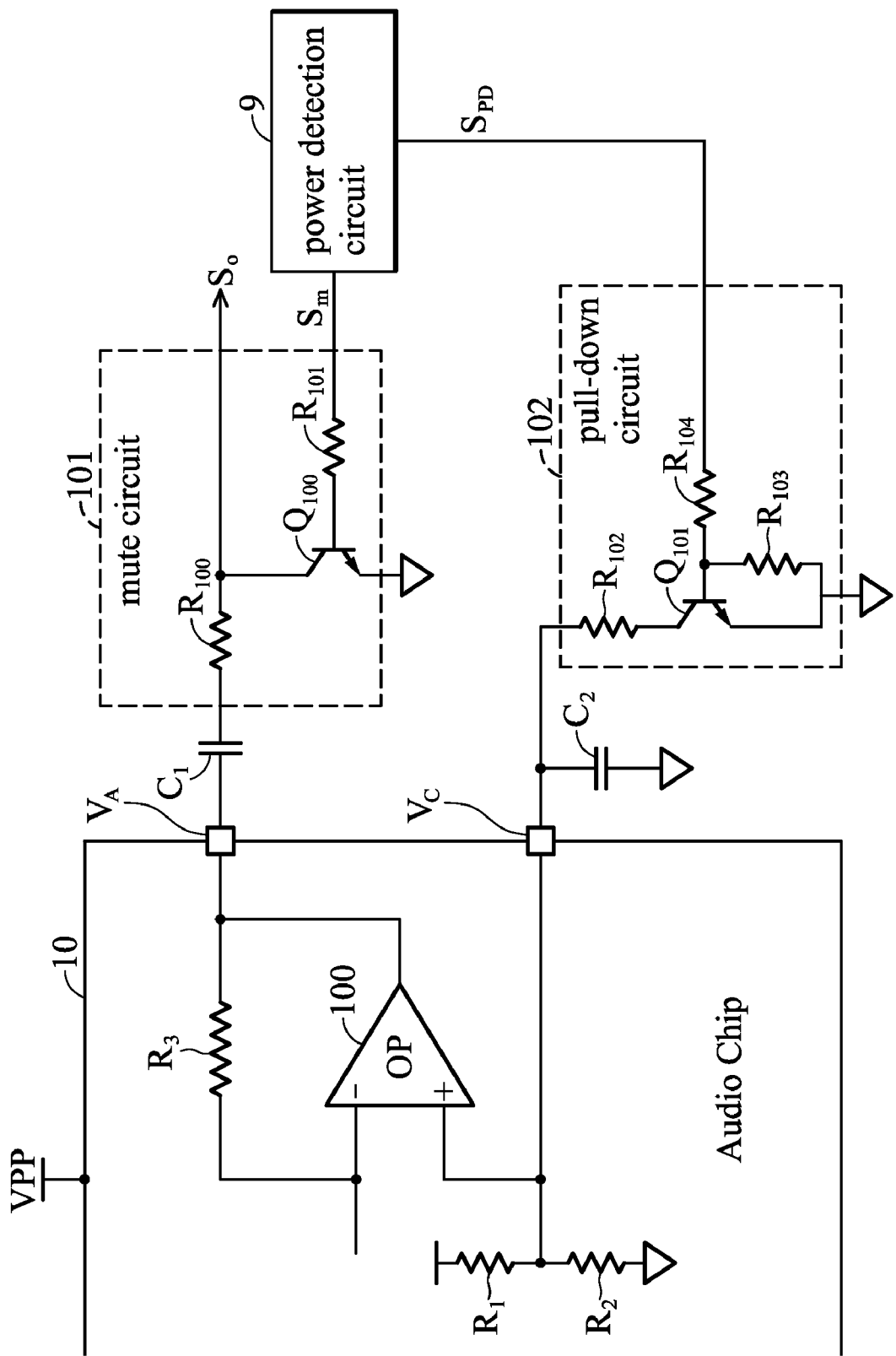
FIG. 10 shows a circuit schematic of an exemplary pull-down circuit according to the invention, incorporating the power detection circuit in FIG. 9.

FIG. 10 shows a circuit schematic of an exemplary pull-down circuit according to the invention, incorporating the power detection circuit in FIG. 9, where mute circuit 101 comprises resistors R100, R101, and transistor Q100, pull-down circuit comprises resistors R102 through R104 and transistor Q101.

Pull-down circuit 102 incorporates resistor 103 to suppress base-emitter voltage of transistor Q101 to ensure transistor Q101 is not turned on during a power-up operation. Resistors R103 and R104 constitute a voltage divider. The resistance of resistors R103 and R104 may be selected to derive a base-emitter voltage potential less than pull-down signal $S_{PD}$. Since pull-down signal $S_{PD}$ in the power detection circuit of FIG. 9 is at a higher voltage potential in power-down operation than in power-up operation, the voltage divider can produce the base-emitter voltage potential insufficient to turn on transistor Q101 during the power-up, yet sufficient to turn on transistor Q101 during the power-down.

Figure 11:
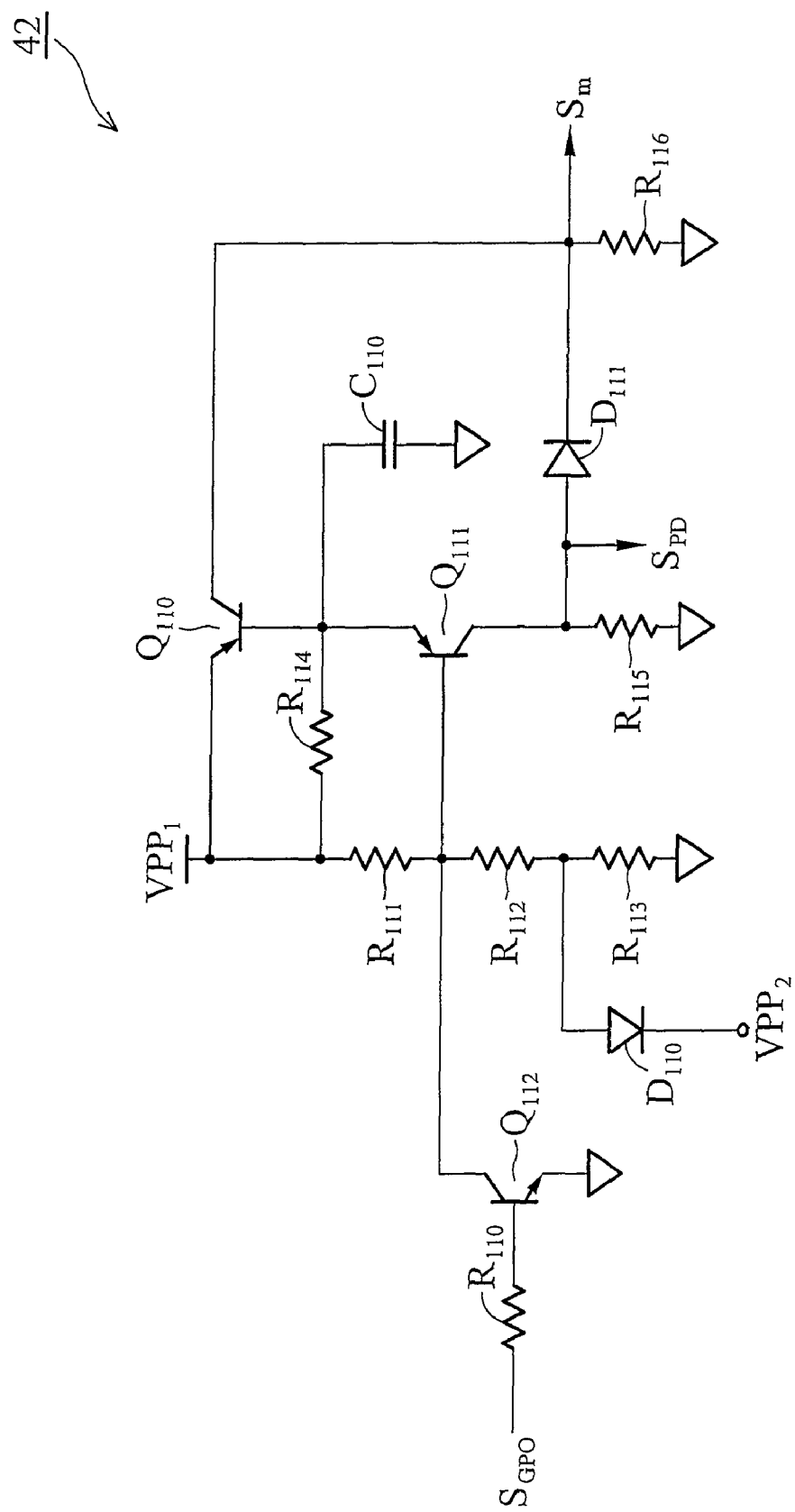
FIG. 11 is a circuit schematic of yet another exemplary power detection circuit according to the invention.

FIG. 11 is a circuit schematic of yet another exemplary power detection circuit according to the invention, transistors Q110 to Q112, resistors R110 through R116, capacitor C110, and diodes 110 to 111.

Power detection circuit 42 detects two sets of power supply voltage VPP1 and VPP2. Power supply voltage VPP2 may be analog or digital, internal or external power in audio chip 10.

When power supply voltage VPP1 is provided and power supply voltage VPP2 is absent, diode D110 is forward biased and conducts, pulling the voltage at the node between resistors R112 and R113 to diode voltage of diode D110, such as, 0.7V. First emitter is at low voltage potential, and first base at high voltage potential, thus turning off transistor Q110. Second base is at low voltage potential and second emitter at high, hence transistor Q111 is on, outputting pull-down signal $S_{PD}$ and mute signal $S_m$.

When power supply voltages VPP1 and VPP2 are both present, diode D110 is reversed biased and disabled, the voltage at the node between resistors R112 and R113 is established by current flowing through resistor R113, which may be 3V, for example. First emitter and first base are at high voltage potential, thus turning off transistor Q110. Similarly, second base and second emitter are both at high voltage potential, hence transistor Q111 is also off, outputting no pull-down signal $S_{PD}$ and mute signal $S_m$.

While only two power supply voltages are detected using the power detection circuit in FIG. 11, those skilled in the art can modify the circuit to accommodate power detection for more than two supply voltages without deviating from the principle of the invention.

While BJT devices are utilized in the embodiment in FIG. 1 through FIG. 11, other electrical switching devices such as MOSFET and the like can be used to accommodate the requirement of the circuits, and those skilled in the art can make modification as appropriate with the principle of the invention.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An apparatus, comprising:
    an amplifier, receiving a power supply voltage and a common mode voltage, and amplifying an audio input signal to generate an audio output signal;
    a mute circuit, connected to the output of the amplifier via a direct current (DC) blocking capacitor, the mute circuit conducting the audio output signal at the output of the amplifier to about ground level upon receiving a mute signal;
    a pull-down circuit, coupled to the amplifier, the pull down circuit pulling the common mode voltage to about ground level upon receiving a pull-down signal; and
    a power detection circuit, coupled to the mute circuit and the pull-down circuit, the power detection circuit detecting power-up or power-down of the power supply voltage, and generating the mute signal and the pull-down signal according to the power-up or power-down operation.

2. The apparatus of claim 1, wherein the power detection circuit further comprises:
    a power-on detection unit detecting a power-on operation and generating a first signal;
    a power-off detection unit detecting a power-down operation and generating a second signal; and a signal selection unit outputting the mute signal and the power-down signal according to the first signal and the second signal.

3. The apparatus of claim 1, wherein the power detection circuit generates the pull-down signal prior to the power supply voltage falling below a minimal operating voltage of the amplifier.

4. The apparatus of claim 1, wherein the power detection circuit further receives a GPIO control signal in a predetermined power-down operation to generate the mute signal and the pull-down signal.

5. The apparatus of claim 1, wherein the power detection circuit generates only the mute signal during the power-up operation, and the mute and pull-down signals during the power-down operation.

6. The apparatus of claim 1, wherein the power detection circuit comprises:
a first switching device generating the mute signal;
a second switching device generating the mute and the pull-down signals a first capacitor, coupled to the first and second switching devices, the first capacitor enabling the first switching device during the power-up, and the second switching device during the power-down; and
a first diode, coupled between the first and second switching devices.

7. The apparatus of claim 1, wherein the power detection circuit comprises:
a first switching device having first base, first collector, and first emitter, the first emitter being coupled to the power supply voltage, the first collector providing the mute signal;
a second switching device having second base, second collector, and second emitter, the second base being coupled to the power supply voltage, the second emitter being coupled to the first base, and the second collector providing the pull down signal;
a third switching device having third base, third collector, and third emitter, the third base receiving a GPIO control signal, the third collector being coupled to the second base, and the third emitter being coupled to ground;
a first capacitor, coupled between the power supply voltage, first base, and second emitter, and ground; and
a first diode, coupled between the first and second collectors.

8. The apparatus of claim 1, wherein the pull-down circuit comprises a fourth switching device, coupled to the amplifier, the fourth switching device turning on to pull down the common mode voltage when receiving the pull-down signal.

9. The apparatus of claim 1, wherein the power detection circuit comprises:
a first switching device generating the mute signal;
a second switching device generating the mute and the pull-down signals a first capacitor, coupled to the first and second switching devices, the first capacitor enabling the first switching device during the power-up, and the second switching device during the power-down; and
first and second resistors, coupled in series to each other between the first and second switching devices, and generating the pull-down signal so that the pull-down circuit does not pull down the common mode voltage during the power-up.

10. The apparatus of claim 9, wherein the pull-down circuit comprises:
a fourth switching device, having fourth base, collector and emitter, the fourth collector being coupled to the amplifier, the fourth emitter being coupled to ground, turning on to pull down the common mode voltage when receiving the pull-down signal; and
third and fourth resistors coupled in series to each other, dividing the pull-down signal to disable the fourth switching device during the power-up, and enable the fourth switching device during the power-down.

11. The apparatus of claim 1, wherein the power detection circuit comprises:
a first switching device having first base, first collector, and first emitter, the first base being coupled to the power supply voltage;
a second switching device having second base, second collector, and second emitter, the second base being coupled to the power supply voltage, the second emitter being coupled to the first base, and the second collector providing the pull down signal;
a third switching device having third base, third collector, and third emitter, the third base receiving a GPIO control signal, the third collector being coupled to the second base, and the third emitter being coupled to ground;
a first capacitor, coupled between the power supply voltage, first base, and second emitter, and ground;
a first resistor, coupled to the first collector, and a second resistor, coupled between the second collector and the first resistor.

12. A muting circuit, comprising:
a mute circuit, connected to an output of an amplifier via a direct current (DC) blocking capacitor, the mute circuit receiving an audio output signal of the amplifier, and conducting the audio output signal at the output of the amplifier to about ground level upon receiving a mute signal;
a pull-down circuit, coupled to the amplifier, the pull down circuit pulling a common mode voltage of the amplifier to about ground level upon receiving a pull-down signal; and
a power detection circuit, coupled to the mute circuit and the pull-down circuit, the power detection circuit detecting power-up or power-down of the power supply voltage, and generating the mute signal and a pull-down signal according to the power-up or power-down operation.

13. The muting circuit of claim 12, wherein the power detection circuit further comprises:
a power-on detection unit detecting a power-on operation and generating a first signal;
a power-off detection unit detecting a power-down operation and generating a second signal; and
a signal selection unit outputting the mute signal and the power-down signal according to the first signal and the second signal.

14. The muting circuit of claim 12, wherein the power detection circuit generates the pull-down signal prior to the power supply voltage falls below a minimal operating voltage of the amplifier.

15. The muting circuit of claim 12, wherein the power detection circuit further receives a GPIO control signal in a predetermined power-down operation to generate the mute signal and the pull-down signal.

16. The muting circuit of claim 12, wherein the power detection circuit generates only the mute signal during the power-up operation, and the mute and pull-down signals during the power-down operation.

17. The muting circuit of claim 12, wherein the power detection circuit comprises:
a first switching device generating the mute signal;

a second switching device generating the mute and the pull-down signals a first capacitor, coupled to the first and second switching devices, the first capacitor enabling the first switching device during the power-up, and the second switching device during the power-down; and a first diode, coupled between the first and second switching devices, the first diode outputting the pull-down signal.

18. The muting circuit of claim 12, wherein the power detection circuit comprises:
   a first switching device having first base, first collector, and first emitter, the first base being coupled to the power supply voltage, the first collector providing the mute signal;
   a second switching device having second base, second collector, and second emitter, the second base being coupled to the power supply voltage, the second emitter being coupled to the first base, and the second collector providing the pull down signal;
   a third switching device having third base, third collector, and third emitter, the third base receiving a GPIO control signal, the third collector being coupled to the second base, and the third emitter being coupled to ground;
   a first capacitor, coupled between first base, second emitter, and ground; and
   a first diode, coupled between the first and second collectors.

19. The muting circuit of claim 12, wherein the pull-down circuit comprises a fourth switching device, coupled to the amplifier, the fourth switching device turning on to pull down the common mode voltage when receiving the pull-down signal.

20. The muting circuit of claim 12, wherein the power detection circuit comprises:
   a first switching device generating the mute signal;
   a second switching device generating the mute and the pull-down signals a first capacitor, coupled to the first and second switching devices, the first capacitor enabling the first switching device during the power-up, and the second switching device during the power-down; and
   first and second resistors, coupled in series to each other between the first and second switching devices, the first and second resistors generating the pull-down signal so that the pull-down circuit does not pull down the common mode voltage during the power-up.

21. The muting circuit of claim 20, wherein the pull-down circuit comprises:
   a fourth switching device, having fourth base, collector and emitter, the fourth collector being coupled to the amplifier, the fourth emitter being coupled to ground, the fourth switching device turning on to pull down the common mode voltage when receiving the pull-down signal; and
   third and fourth resistors coupled in series to each other, the third and fourth resistors dividing the pull-down signal to disable the fourth switching device during the power-up, and enable the fourth switching device during the power-down.

22. The muting circuit of claim 12, wherein the power detection circuit comprises:
   a first switching device having first base, first collector, and first emitter, the first emitter being coupled to the power supply voltage;
   a second switching device having second base, second collector, and second emitter, the second base being coupled to the power supply voltage, the second emitter being coupled to the first base, and the second collector providing the pull down signal;
   a third switching device having third base, third collector, and third emitter, the third base receiving a GPIO control signal, the third collector being coupled to the second base, and the third emitter being coupled to ground;
   a first capacitor, coupled between first base, second emitter, and ground;
   a first resistor, coupled to the first collector, and a second resistor, coupled between the second collector and the first resistor.

* * * * *